US007254790B2

(12) United States Patent
Lee et al.

(10) Patent No.: US 7,254,790 B2
(45) Date of Patent: Aug. 7, 2007

(54) METHOD OF MOMENT COMPUTATIONS IN R(L)C INTERCONNECTS OF HIGH SPEED VLSI WITH RESISTOR LOOPS

(75) Inventors: Herng-Jer Lee, Tao-Yuan (TW); Chia-Chi Chu, Tao-Yuan (TW); Wu-Shiung Feng, Tao-Yuan (TW); Ming-Hong Lai, Tao-Yuan (TW)

(73) Assignee: Chang Gung University, Tao-Yuan (TW)

( * ) Notice: Subject to any disclaimer, the term of this patent is extended or adjusted under 35 U.S.C. 154(b) by 428 days.

(21) Appl. No.: 10/889,795

(22) Filed: Jul. 13, 2004

(65) Prior Publication Data

US 2006/0015832 A1    Jan. 19, 2006

(51) Int. Cl.
G06F 17/50 (2006.01)
G06F 17/10 (2006.01)

(52) U.S. Cl. .................... 716/4; 716/1; 716/2; 716/5; 716/6; 716/7; 716/8; 703/2; 703/14

(58) Field of Classification Search ............. 716/1, 716/2, 4–8; 703/2, 14; 330/286; 327/44, 327/76.44
See application file for complete search history.

(56) References Cited

U.S. PATENT DOCUMENTS

| | | | | |
|---|---|---|---|---|
| 3,693,081 | A * | 9/1972 | Aviander ............... | 324/76.44 |
| 4,250,453 | A * | 2/1981 | Nilsson ................ | 327/44 |
| 5,379,231 | A * | 1/1995 | Pillage et al. ............ | 703/14 |
| 5,416,300 | A * | 5/1995 | Hickl et al. ............. | 219/262 |
| 5,451,905 | A * | 9/1995 | Gamand et al. .......... | 330/286 |
| 5,617,325 | A * | 4/1997 | Schaefer ............... | 716/6 |
| 5,883,811 | A * | 3/1999 | Lam .................. | 716/6 |
| 6,047,117 | A | 4/2000 | Kahng et al. ......... | 395/500.34 |
| 6,088,523 | A * | 7/2000 | Nabors et al. ........... | 703/14 |
| 6,308,304 | B1 | 10/2001 | Devgan et al. .......... | 716/5 |
| 6,314,546 | B1 | 11/2001 | Muddu ................ | 716/5 |
| 6,347,393 | B1 | 2/2002 | Alpert et al. ............ | 716/2 |
| 6,460,165 | B1 * | 10/2002 | Ismail et al. ............ | 716/1 |
| 6,601,233 | B1 | 7/2003 | Underwood ............ | 717/102 |
| 6,662,149 | B1 | 12/2003 | Devgan et al. ........... | 703/14 |

(Continued)

OTHER PUBLICATIONS

Lee et al., "Applications of tree/link partitioning for moment computations of general lumped RLC networks with resistor loops", May 23-26, 2004, Circuits and Systems, 2004. ISCAS '04. Proceedings of the 2004 International Symposium on vol. 1, pp. I—713-716.*

(Continued)

*Primary Examiner*—Paul Dinh
*Assistant Examiner*—Helen Rossoshek
(74) *Attorney, Agent, or Firm*—C. G. Mersereau; Nikolai & Mersereau, P.A.

(57) ABSTRACT

A moment computation technique for general lumped R(L)C interconnect circuits with multiple resistor loops is proposed. Using the concept of tearing, a lumped R(L)C network can be partitioned into a spanning tree and several resistor links. The contributions of network moments from each free and the corresponding links can be determined independently. By combining the conventional moment computation algorithms and the reduced ordered binary decision diagram (ROBDD), the proposed method can compute system moments efficiently. Experimental results demonstrate that the proposed method can indeed obtain accurate moments and is more efficient than the conventional approach.

3 Claims, 8 Drawing Sheets

U.S. PATENT DOCUMENTS

| | | | |
|---|---|---|---|
| 6,789,237 B1* | 9/2004 | Ismail | 716/4 |
| 7,007,249 B2* | 2/2006 | Ly et al. | 716/4 |
| 7,103,863 B2* | 9/2006 | Riepe et al. | 716/7 |
| 7,117,461 B1* | 10/2006 | Srinivasan et al. | 716/4 |
| 7,124,381 B2* | 10/2006 | Lee et al. | 716/4 |
| 2005/0021319 A1* | 1/2005 | Li et al. | 703/2 |
| 2005/0096888 A1* | 5/2005 | Ismail | 703/2 |
| 2006/0010406 A1* | 1/2006 | Lee et al. | 716/5 |
| 2006/0100830 A1* | 5/2006 | Lee et al. | 703/2 |

OTHER PUBLICATIONS

Yang et al., "RLC interconnect delay estimation via moments of amplitude and phase response", Nov. 7-11, 1999, ☐☐Computer-Aided Design, Digest of Technical Papers. IEEE/ACM International Conference on, pp. 208-213.*

Gao et al., "Propagation delay in RLC interconnection networks", May 3-6, 1993, Circuits and Systems, ISCAS '93, IEEE International Symposium on, pp. 2125-2128.*

Dabrowski, J.J., "Efficient post-layout timing verification via RLC trees and explicit PWL timing integration", Sep. 15-18, 2002, Electronics, Circuits and Systems, 9th International Conference on, vol. 2, pp. 689-692.*

Qingjian et al., "Moment computation of lumped and distributed coupled RC trees with application to delay and crosstalk estimation", May 2001, Proceedings of the IEEE, vol. 89, Issue 5, pp. 772-788.*

* cited by examiner (a)

(b)

(c)

(a)

(b)

(c)

METHOD OF MOMENT COMPUTATIONS IN R(L)C INTERCONNECTS OF HIGH SPEED VLSI WITH RESISTOR LOOPS

BACKGROUND OF THE INVENTION

1. Field of the Invention

The present invention relates to a method of computing moments in RLC interconnects of high-speed VLSI circuits and, more particularly, to a method of moment computations of lumped interconnect circuits with resistor loops.

2. Description of Related Art

With the advance of modem VLSI techniques, delay and signal/power integrity issues on interconnects have played a significant role on performances of an IC design. To address these issues effectively, interconnects are often modeled as lumped or distributed R(L)C circuits. Owing to the increasing wire density and the required modeling accuracy, the wire model for practical chip designs may be with a huge scale. Thus, using traditional circuit simulators, such as SPICE, to simulate such circuits become inefficient and impractical.

In order to solve this task, moment matching methods have been widely applied in the past for timing analysis, crosstalk estimations, power/ground network analysis, and generating reduced-order models of VLSI interconnect models. For example, see U.S. Pat. Nos. 6,047,117; 6,308,304; 6,314,546; 6,347,393; 6,601,223; and 6,662,149. Since interconnects are often modeled as R(L)C trees, the moments at nodes on the frees can be calculated recursively in an efficient manner (L. T. Pillage and R. A. Rohrer, "Asymptotic waveform evaluation for timing analysis," IEEE Trans. on CAD, Vol. 9, No. 4, pp. 352-366, 1990; C. L. Ratzlaff and L. T. Pillage, "RICE: Rapid interconnect circuit evaluation using AWE," IEEE Trans. on CAD, Vol. 13, No. 6, pp. 763-776, 1994; Q. Yu, and E. S. Kuh, "Exact moment matching models of transmission lines and application to interconnect delay estimation," IEEE Trans. on VLSI Systems, Vol. 3, No. 2, pp. 311-322, 1995; Q. Yu, and E. S. Kuh, "Moment computation of lumped and distributed coupled RC frees with application to delay and crosstalk Estimation," Proceedings of the IEEE, Vol. 89, No. 5, pp. 772-788, 2001; and Q. Yu, E. S. Kuh and T. Xue, "Moment models of general transmission lines with application to interconnect analysis and optimization," IEEE Trans. on VLSI Systems, Vol. 4, No. 4, pp. 477-494, 1996. However, if interconnect structures contain resistor loops (links), which have been widely considered in power/ground or clock networks, or dielectric losses, these moment computation formulas need to be modified due to do currents flowing through these links.

In recent work, Chan et al. proposed a technique to compute the Elmore delay called the first-order moment) in general RC networks •P. K. Chan and K. Karplus, "Computing signal delay in general RC networks by tree/link partition," IEEE Trans. on CAD, vol. 9, no. 8, pp. 898-902, 1990•. Ratzlaff et al. extended the branch tearing for computing moments of the interconnect circuits with resistor loops •C. L. Ratzlaff and L. T. Pillage, "RICE: Rapid interconnect circuit evaluation using AWE," IEEE Trans. on CAD, vol. 13, no. 6, pp. 763-776, 1994•. The basic idea of the above two approaches is using the concept of Kron's method. The interconnect network can be partitioned into a spanning tree and several key links. As a result, delays at nodes of a given tree can be obtained by sequentially appending these links back to reconstruct the original network •R. A. Rohrer, "Circuit partitioning simplified," IEEE Trans. on Circuits and Systems, vol. 35, no. 1, pp. 2-5, 1988•. The key techniques of tree/link partitions are the substitution theorem and the superposition theorem. If the circuit network contains only one resistor link, the computational cost is low. Nevertheless, for multiple resistor links, the problem becomes more complicated since the currents flowing through unopened resistor links are required to be known in advance. Ratzlaff et al. demonstrated that the computational costs are rather high with a large number of links.

SUMMARY OF THE INVENTION

In this invention, an efficient moment computation technique based on tree/link partitioning is provided for R(L)C interconnect networks with single and multiple resistor links and, in particular, on lumped R(L)C interconnect models. To address the issues with a single resistor link, the conventional recursive moment computation formulae for R(L)C frees and the concept of tree/link partitioning are combined. Thus the corresponding computational complexity can also retain linear. To simplify the computational complexity associated with multiple links, a reduced ordered binary-decision diagram (ROBDD) is constructed to store the state variables of the zeroth-order moments. Moments at nodes on R(L)C trees can be updated recursively. The computational cost is proportional to $O(t^2n)$, where t denotes the number of links and n represents the number of nodes. Since the number of resistor links for a general R(L)C interconnect network is much less than that of nodes, t<<n, the cost of moment computations can be reduced to $O(n)$. Finally, two practical interconnect examples using current technology information, including an R(L)C tree network with multiple resistor links, and an RC mesh network, will be demonstrated to illustrate the accuracy of the method of the present invention.

Further benefits and advantages of the present invention will become apparent after a careful reading of the detailed description with appropriate reference to the accompanying drawings.

DETAILED DESCRIPTION OF THE INVENTION

Figure 1:
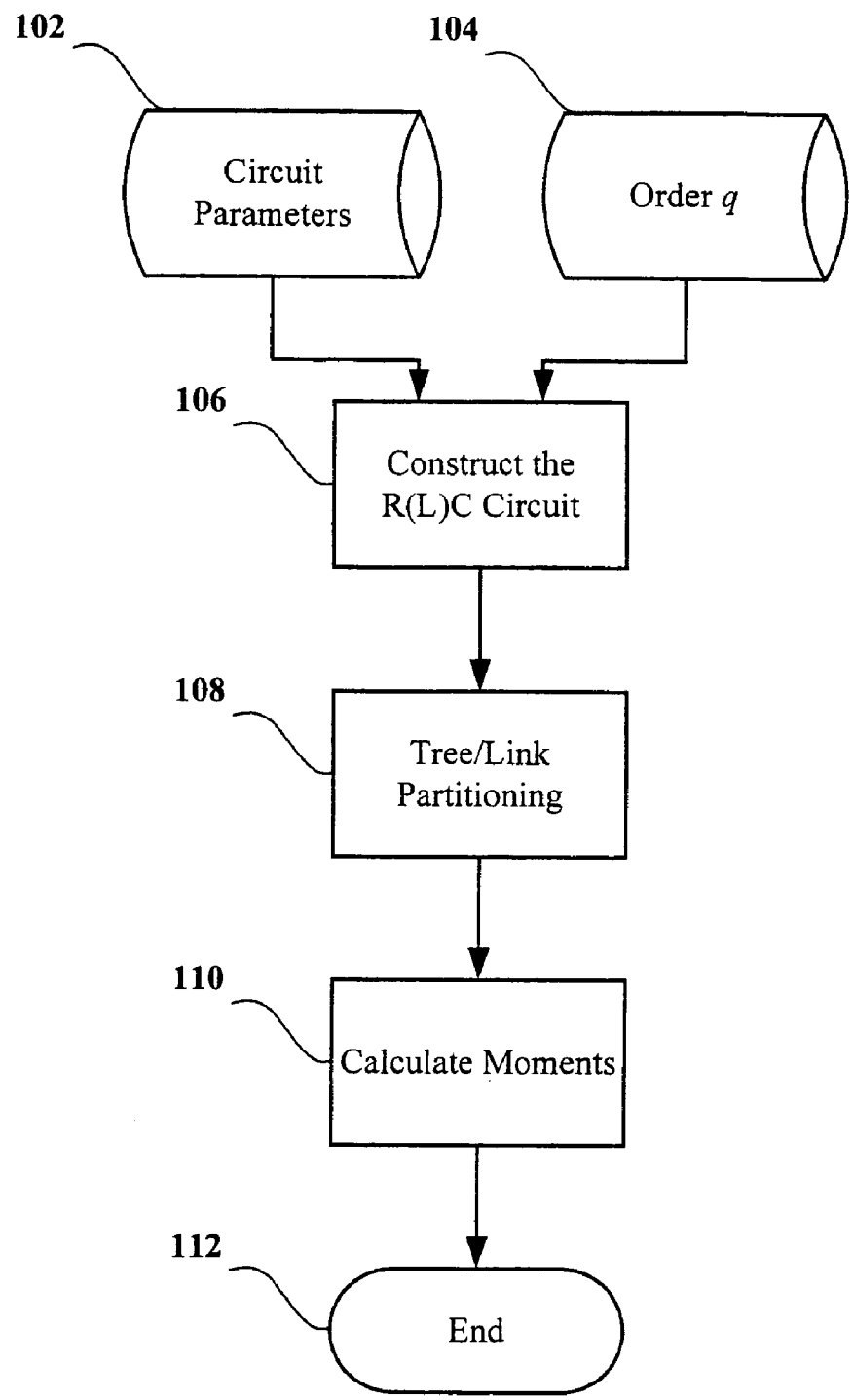
FIG. 1 is a flow chart of the present invention.

The flow chart of the invention is shown is FIG. 1. Initially, two input files, circuit parameters of interconnects 102 and the order q 104, need to be included. Step 106 constructs the matrices of the modified nodal analysis. Step 108 partitions the circuit in interconnects 102 into a spanning tree and several resistor links. Step 110 updates the moments according to the influences of these incrementally added links. It can be achieved by applying the reduced-order-binary-decision-diagram (ROBDD). Step 112 ends the algorithm. The details of the above steps are described as follows.

Figure 2:
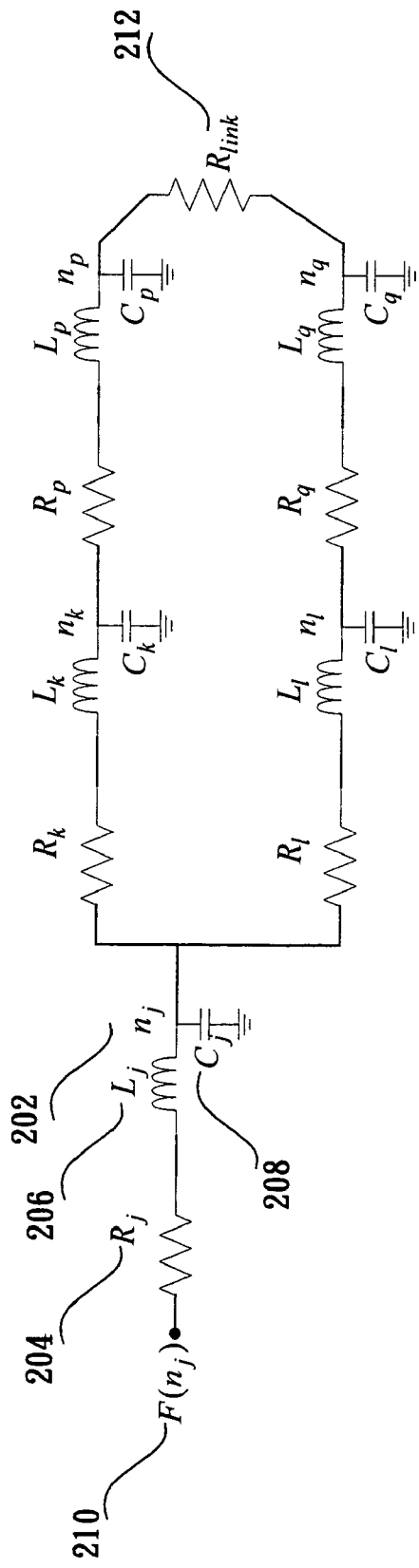
FIG. 2 is used to describe the notation of the present invention.

The notation of this invention is described as follows: t denotes the number of the resistor links in the circuit, and L generally represents the resistance link. For each Thevenin equivalent circuit T(i,j), the first variable i represents the resistor links numbering 1 to i in the original circuit and is located in the i-th layer of the ROBDD tree, i.e. i<=t. The second variable j denotes the resistance link numbering j in the original circuit. As shown in FIG. 2, $n_j$ 202 represents a node in the circuit and $F(n_j)$ 210 represents the corresponding father node. For a RLC circuit, $R_j$ 204, $L_j$ 206, and $C_j$ 208 denote the resistance, inductance, and capacitance between nodes $n_j$ 202 and $F(n_j)$ and $n_k$ and $n_l$ are the corresponding son nodes of $n_j$ 202, which are defined as $S(j)=\{n_k,n_l\}$. $R_{link}$ 212 is a resistor link.

Special R(L)C Trees

If a R(L)C interconnect network has a special free structure, the computational cost can be further reduced. An R(L)C tree includes floating resistors (and inductors) from the ground and capacitors that connect nodes on the tree and to the ground. A lumped R(L)C-tree model excludes transmission lines, couplings, and resistor loops.

Let $N=\{n_0,n_1,n_2,\ldots,n_n\}$ be the set of nodes in the tree network. Suppose that a voltage source with an impulse function $\delta(t)$ is connected between node $n_0$ and ground. For each node $n_j \in \{N-n_0\}$, the grounding capacitor connected at node $n_j$ is denoted as $C_j$. Let $V_j(s)$ and $I_j(s)$ be the transfer functions of the voltage at node $n_j$ and the current entering into node $n_j$, respectively. Expanding $V_j(s)$ and $I_j(s)$ in power series produces $$V_j(s) = \sum_{k=0}^{\infty} v_{j,k} s^k \text{ and } I_j(s) = \sum_{k=0}^{\infty} I_{j,k} s^k,$$

where $V_{j,k}$ and $I_{j,k}$ are called the kth-order moment of the voltage $v_j(s)$ and the current $I_j(s)$. At node $n_0$, the voltage moments are $V_{0,0}=1$ and $V_{0,k}=0$ for k>0. For each grounding capacitor $C_j$, the capacitive current $I_{C_{j,k}}=C_j V_{j,k-1}$. Its zeroth-order moment $I_{C_{j,0}}$ equals to zero and the kth-order (k>0) moment $I_{C_{j,k}}$ equals to $C_j V_{j,k-1}$. The results imply that the capacitor is equivalent to an open circuit if k=0, or otherwise to a current source. For RLC trees, $E_{Lj,k}=L_j I_{j,k-1}$ represents the kth-order inductance voltage moment of $E_{Lj}(s)$, which is the voltage drop across inductance $L_j$ between nodes $n_j$ and F(j). If k>0, $E_{Lj,k}$ is equivalent to a voltage source; otherwise, it behaves as a short circuit. Alternatively, for RC trees, since each $L_j$ is ignored, each $E_{Lj,k}$ is equal to zero.

By using the Kirchhoff's current law and the Kirchhoff's voltage law, voltage moments for each node $n_j \in \{N-n_0\}$ in this lumped R(L)C tree can be calculated by the conventional recursive formulae as follows:

$$I_{j,k} = \begin{cases} 0, & k=0 \\ I_{C_{j,k}} + \sum_{n_x \in S(j)} I_{x,k}, & k>0 \end{cases} \tag{1}$$

$$V_{j,k} = \begin{cases} 1, & k=0 \\ V_{F(j),k} - R_j I_{j,k}, & k>0 \end{cases} \tag{2}$$

The corresponding computational complexity can be shown to be proportional to O(kn), where n is the number of nodes in the circuit and k is the given maximum order.

The aim of this invention is to reduce the cost of moment computations of R(L)C interconnect networks containing a few resistor loops (or links) by tree/link partitioning techniques. By investigating special interconnect tree structures, it can be shown that the computational cost about moments still preserves within the order O(kn).

Tree/Link Partitioning for Moment Computations with A Single Resistor Link

Suppose that a circuit graph G=(N,B) consists of a set of nodes $N=\{n_0,n_1,n_2,\ldots,n_n\}$ and a set of branches $B=\{b_1, B_2,\ldots,b_m\}$. Then, the circuit G can be partitioned into a spanning tree, containing n+1 nodes and n branches, and the complement of the tree (the so-called cotree) comprising t=m-n links $B_L=\{b_{L,1},b_{L,2},\ldots,b_{L,t}\}$. For each node $n_j \in N$, the kth-order moment $V_{j,k}$ can be obtained by combining the contributions from the open circuit and the Thevenin circuit by the superposition theorem.

Figure 3:
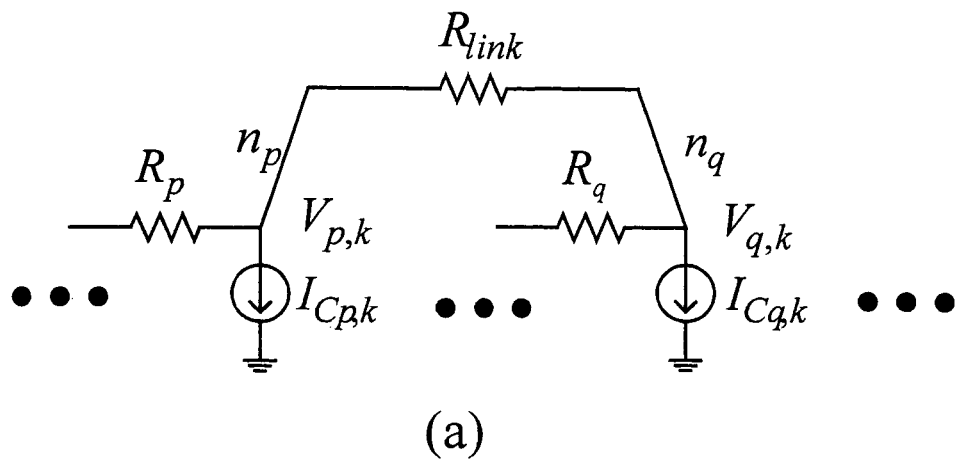
FIG. 3 illustrates the steps of the tree/link partitioning technique for a single resistor link: (a) computing the kth-order voltage moments at nodes in a RC tree with a resistor link, (b) open the link $R_{link}$ and (c) the corresponding Thevenin equivalent circuit while $R_{link}$ is replaced by a current source with 1A.
Figure 3:
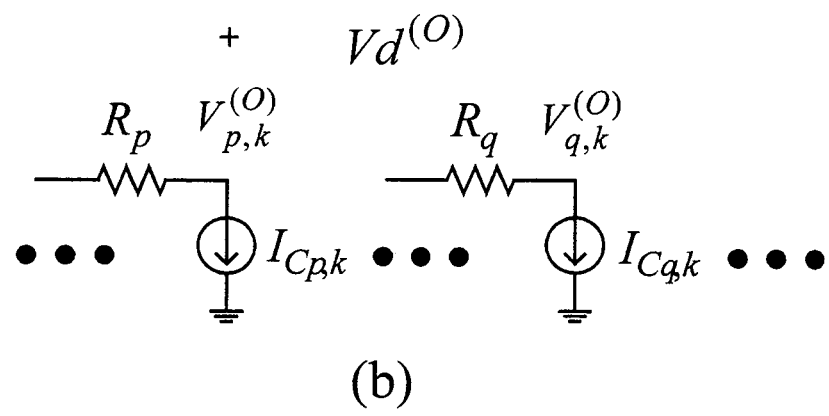
Figure 3:
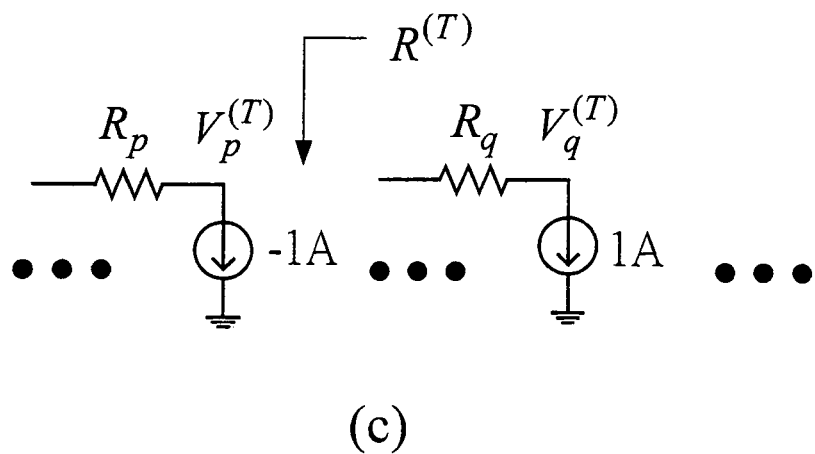

Suppose that a resistor link $R_{link}$ is connected between nodes $n_p$ and $n_q$ in a RC-tree circuit, as shown in FIG. 3(a). Let $V_{j,k}^{(o)}$ be the kth-order voltage moment of $V_j^{(o)}(s)$ at node $n_j$, which is obtained by using the recursive moment computation formulae, Eqs. (1) and (2), with an open $R_{link}$ as shown in FIG. 3(b). Let $V_j^{(T)}$ be the node voltage at node $n_j$ in the Thevenin equivalent circuit in FIG. 3(c). The kth-order voltage moment $V_{j,k}$ at each node $n_j \in N$ can be calculated as below:

$$V_j = V_j^{(o)} + I_R \cdot V_j^{(T)}, \tag{3}$$

where $$I_R = \frac{-Vd^{(o)}}{R_{link} + R^{(T)}}. \tag{4}$$

$Vd^{(o)} = V_{p,k}^{(o)} - V_{q,k}^{(o)}$ represents the voltage moment difference between nodes $n_p$ and $n_q$. $R^{(T)} = V_p^T - V_q^T$ is the Thevenin equivalent resistor seen from $R_{link}$.

Suppose that an R(L)C interconnect network is partitioned into a R(L)C tree and a link resistor $R_{link}$. Each kth-order inductance voltage moment $E_{Lj,k}$ for $n_j \in N$ will be set to be zero in the corresponding Thevenin equivalent circuit. Therefore, the Thevenin equivalent circuit of the RLC interconnect network is the same as that of the RC interconnect network mentioned in this section.

Tree/Link Partitioning for Moment Computations with Multiple Resistor Links

Figure 4:
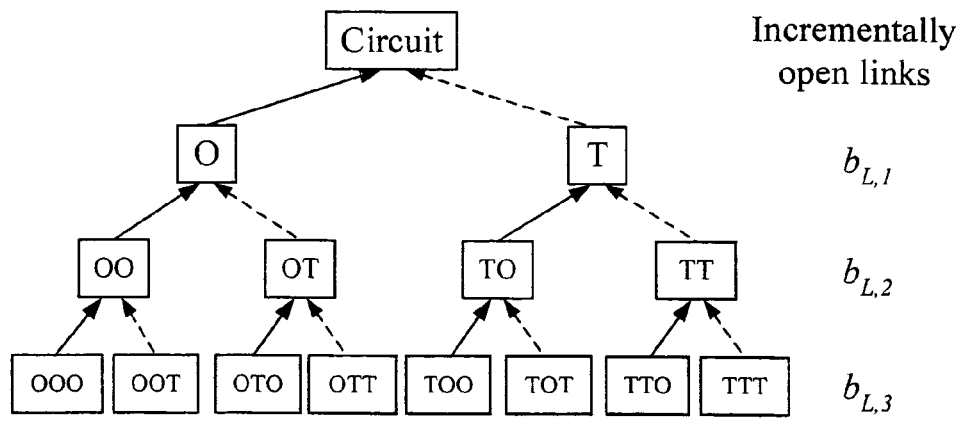
FIG. 4 illustrates the steps of the tree/link partitioning technique for three resistor links: (a) the OBDD tree for multiple links, (b) the ROBDD tree and (c) the further simplified ROBDD tree for computing the kth-order moments (k>0)
Figure 4:
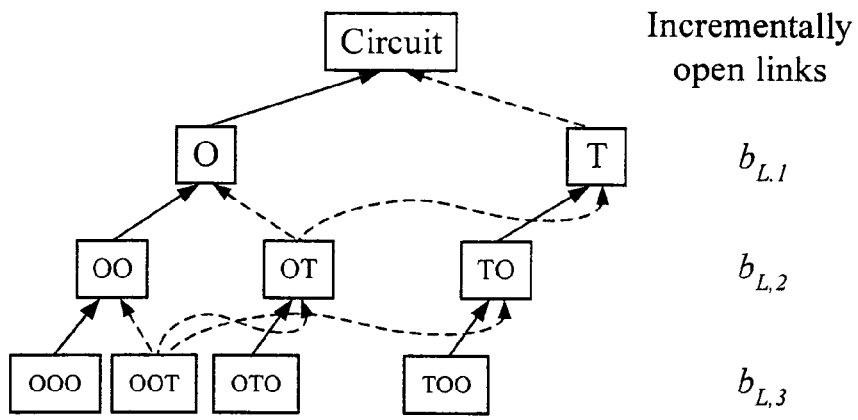
Figure 4:
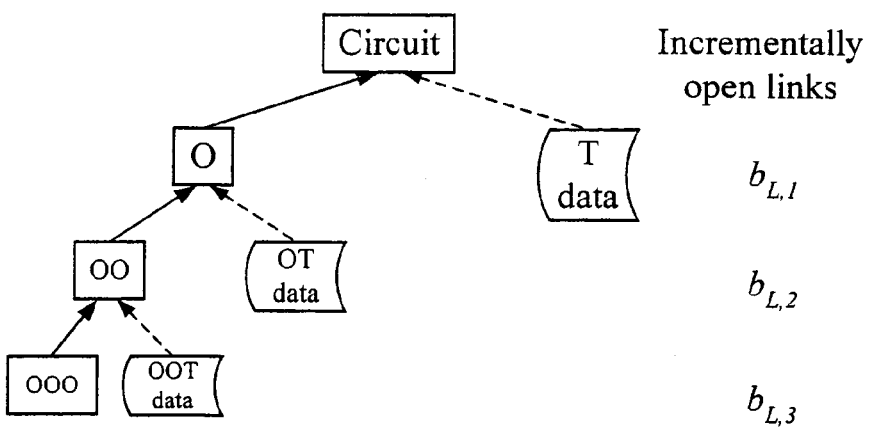

While the interconnect R(L)C network contains multiple resistor links, the moment computation method can still be used with some extensions. However, the problem becomes more complicated. For example, consider a circuit with three links $\{b_{L,1}\ b_{L,2}\ b_{L,3}\}$. If each resistor link is opened and replaced with a 1A current source incrementally, tracing the above steps will form an ordered binary-decision diagram (OBDD), as shown in FIG. 4(a). Block '(O)' represents the 'open circuit', and block 'T' stands for the 'Thevenin equivalent circuit'. Computing moments of each block (or circuit) is equivalent to solving the problem with a single resistor link. Each solid line and each dash line represent inputting $V_{j,k}^{(o)}$ and $V_j^{(T)}$ at node $N_j \in N$, respectively. The exponential growth of the diagram with respect to the number of links t, $2^{t+1}-2$, may lead to algorithms with an exponential worst case time complexity. If the circuit contains a large number of links, the computational cost is very expensive.

In order to reduce the computational cost, an assistant reduced ordered binary-decision diagram (ROBDD) is constructed for storing the intermediate zeroth-order moments of the R(L)C circuits with unopened links. Thus, the moments at nodes on R(L)C trees will be updated by these saved data. The data structure of the ROBDD is compact as shown in FIG. 4(b). Notably, the block number of the diagram is reduced to be square, i.e., $(t^2+3t)/2$.

The ROBDD in FIG. 4(b) can be constructed by the following principles:

1. After replacing a link with a 1A current source, opening all voltage sources, and shorting all other current sources, the Thevenin equivalent circuits in the same level of the OBDD tree are the same. Hence, circuits OT and TT are the same, and circuits OOT, OTT, TOT, and TTT are the same. It can be concluded that the Thevenin equivalent circuits XX . . . XT in the same level are the same, where X may be O or T.

2. Circuits OTO and TOO are similar except for different driver positions. Links $b_{L,2}$ and $b_{L,1}$ are replaced with two 1A current sources in circuits OTO and TOO, respectively. Instead, the same open circuit voltage $Vd^{(O)}$ by opening link $b_{L,3}$ is observed in the two circuits.

3. Except for circuits O, OO, and OOO, all other circuits are independent on order k. Therefore, a further reduced OBDD is constructed in FIG. 4(c). The voltages of circuits OOT, OT, and T need to be saved for updating the voltage moments of circuits OOO, OO, and O, respectively. The computations only involve t operations.

Figure 5:
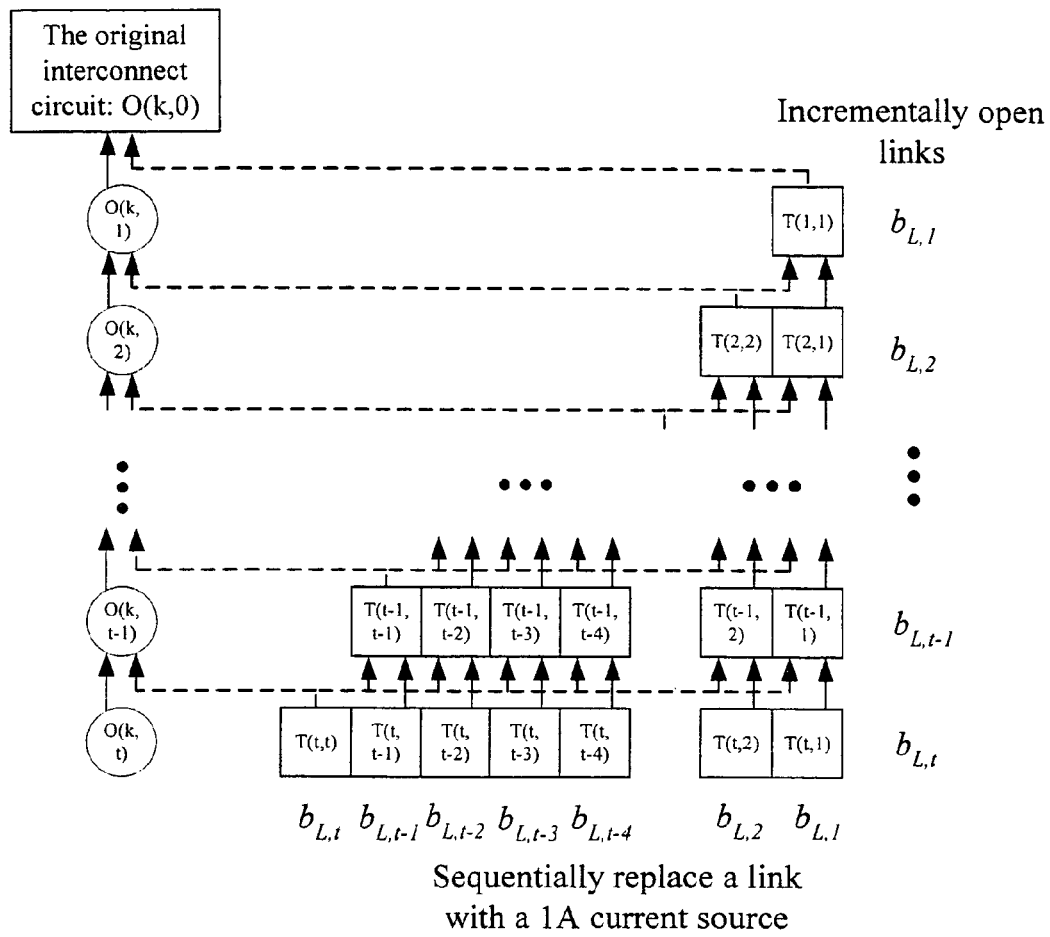
FIG. 5 displays the generalized ROBDD tree for t links.

With aids of the above information, a generalized ROBDD diagram can be built, as shown in FIG. 5, to reconstruct the original circuit with t links. The diagram is composed of two classes of blocks as follows.

1. Block T(i,j) is the Thevenin circuit that all independent sources are set to be zero, links $\{b_{L,1}, b_{L,2}, \ldots b_{L,i}\}$ are opened, and link $b_{L,j}$ is replaced with a 1A current source.

2. Block O(k,i) is the kth-order moment model that links $\{b_{L,1}, b_{L,2}, \ldots b_{L,i}\}$ are opened.

In the above example, circuits OOO, OOT, OTO, and TOO are equivalent to blocks O(k,3), T(3,3), T(3,2), and T(3,1), respectively. Similarly, circuits OO, OT, TO, O, and T behave as blocks O(k,2), T(2,2), T(2,1), O(k,1), and T(1,1), respectively. The solid and dash lines have the same definitions as in FIG. 4.

The computational complexity can still retain linear as long as the number of links is much less than the number of nodes, i.e., t<<n. The complexity analysis is as follows. In FIG. 5, only the blocks at the lowest level, O(t), T(t,t), . . . , T(t,1), involve calculating voltage at each node by recursive moment computation algorithm. The cost is about O((k+t)n), where k is the maximum order of moments. Alternatively, other blocks use Eqs. (3) and (4) to calculate node voltages so that the cost is about $O(k(t-1)n+(t-1)^2n)$. In general moment-matching problems, k<<n. Therefore, the computational complexity of the proposed approach is dominated by $O(t^2n)$. If a circuit network contains only a few links, then, only time complexity O(n) is required for moment computations. However, considering the worst case where O(t)=O(n), the cost will grow up to $O(n^3)$.

Experimental Results

Figure 6:
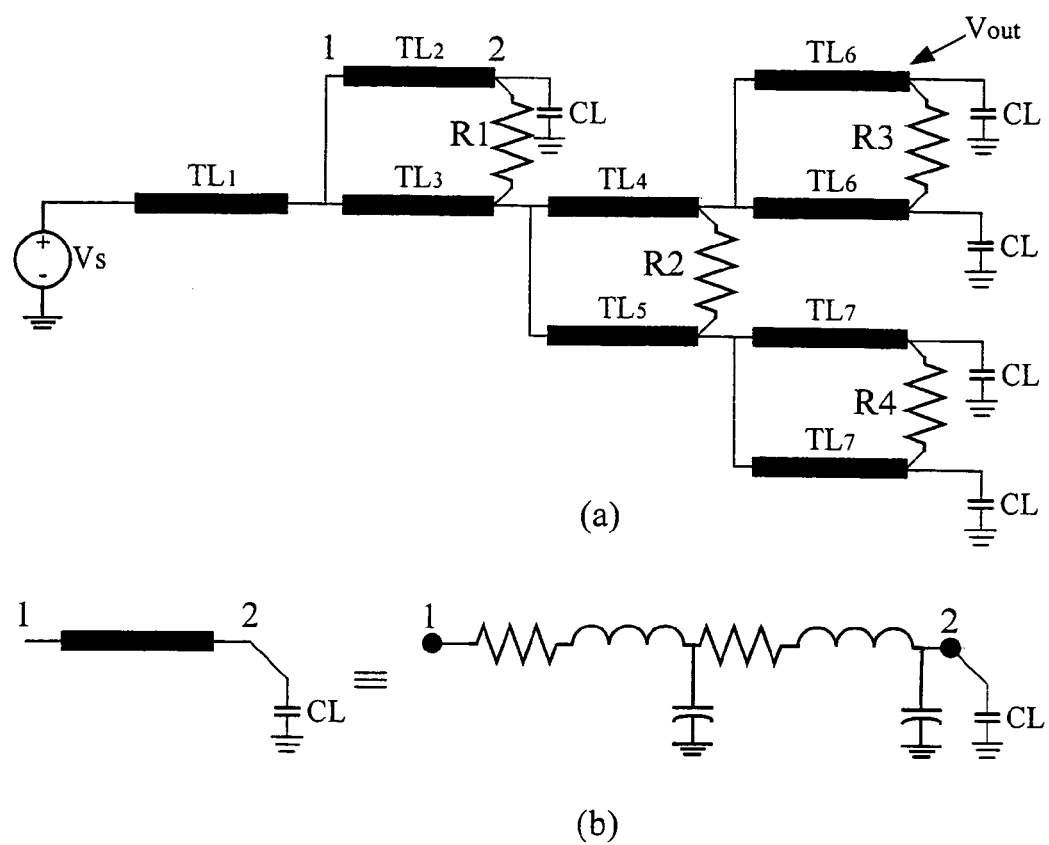
FIG. 6 gives the interconnect circuit in tree structure, where the length of TL1 is 30 mm, TL2=40 mm, TL3=10 mm, TL4=25 mm, TL5=20 mm, TL6=40 mm and TL7=15 mm.
Figure 7:
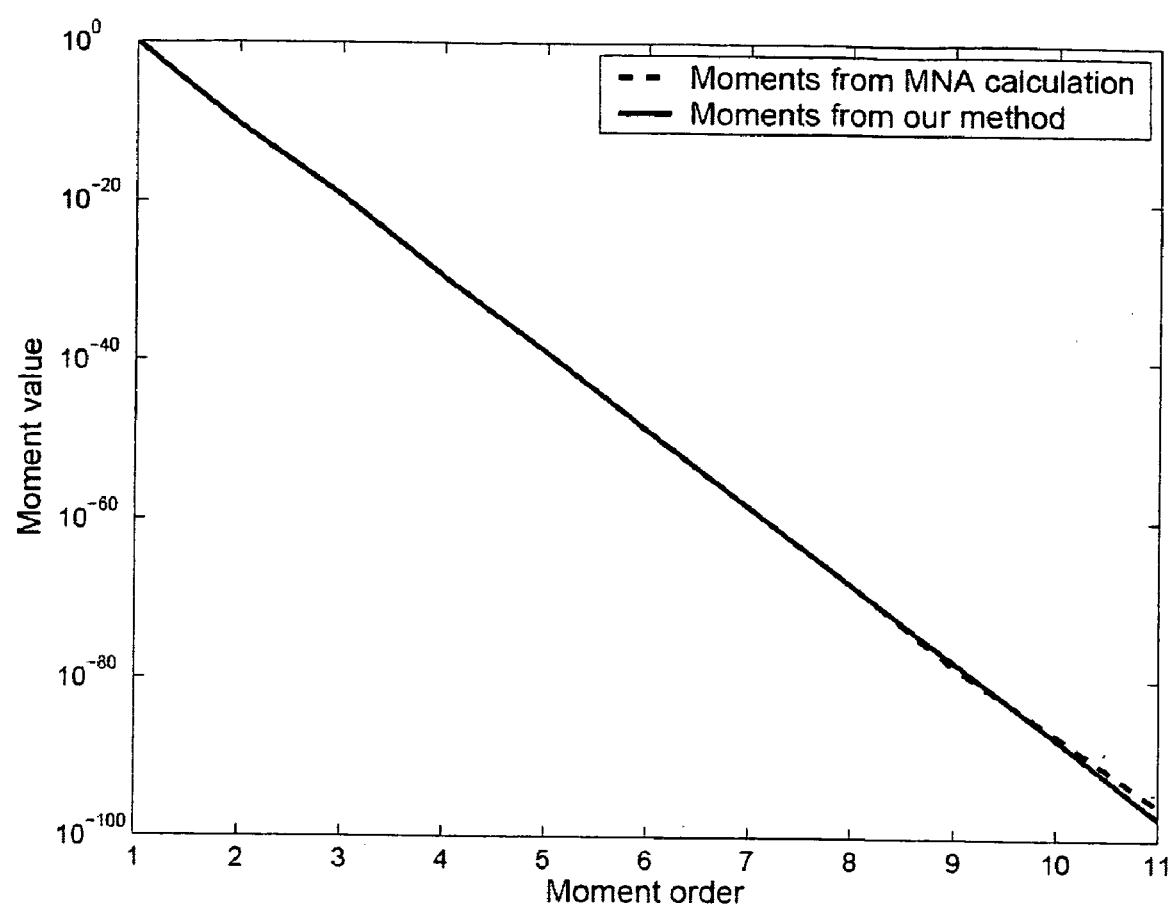
FIG. 7 graphically compares the RLC tree's moment value comparison in MNA method and in the present invention.
Figure 8:
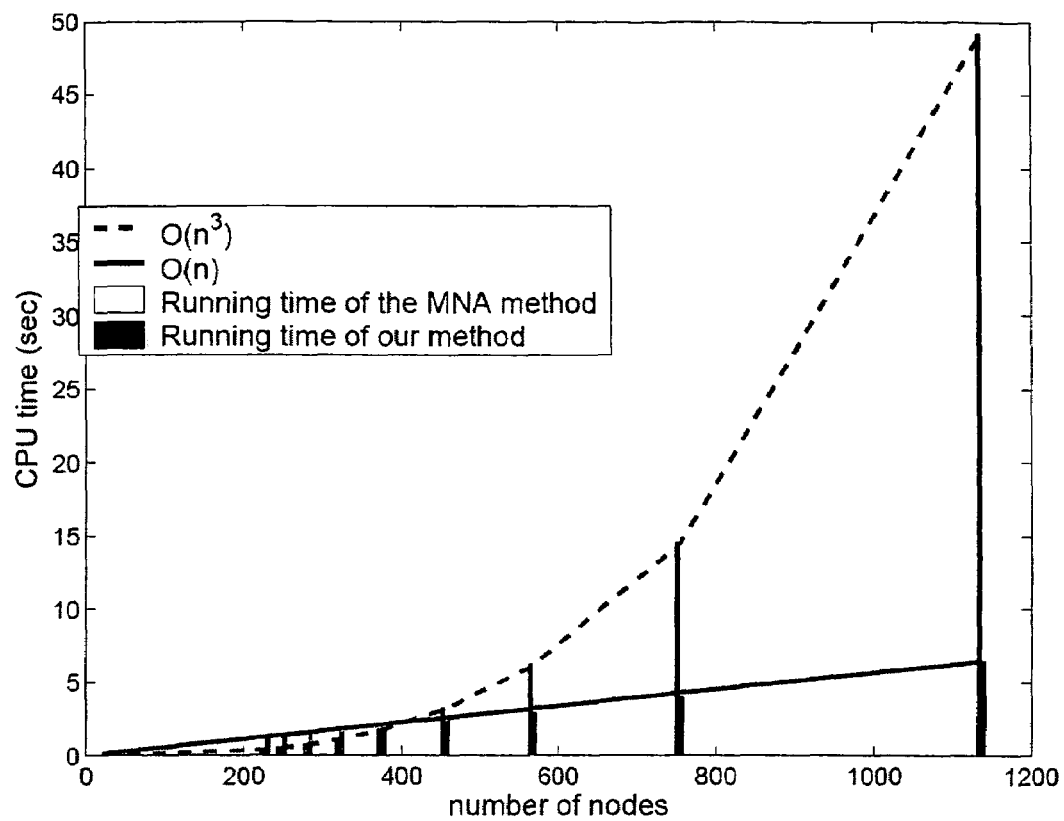
FIG. 8 graphically compares the CPU time diagrams of moment computation for RLC tree circuit via the MNA method and present invention.

As shown in FIG. 6, a circuit composed of nine lines and four resistor links {R1, R2, R3, R4} is studied. The transmission lines are modeled as lumped RLC networks. Each line in the circuit is distributed per 5 mm. Hence, the number of nodes is equal to 44, and the order of the corresponding MNA matrices is equal to 92. For comparison studies, the traditional MNA-based method and the method of the present invention are investigated. To check the accuracy of the method of the present invention, the first 10-order moments are compared in FIG. 7. It is believed that the moment error appearing in the high order may be contributed by the floating-point arithmetic operation errors. In order to compare the computational complexity, each line is distributed with variable lengths: {0.2 mm, 0.3 mm, . . . , 1 mm}. The node numbers of the networks will be set to 1136, 755, . . . , and 226, respectively. FIG. 8. shows the CPU time comparison diagram of the traditional MNA-based method and the method of the present invention. It can be easily observed that the method of the present invention can outperform the traditional MNA-based method.

Although the invention has been explained in relation to its preferred embodiment, it is to be understood that many other possible modifications and variations can be made without departing from the spirit and scope of the invention as hereinafter claimed.

What is claimed is:

1. A method of moment computations comprising:
    providing R(L)C interconnects of a high speed VLSI circuit with resistor loops;
    constructing an assistant reduced ordered binary-decision diagram (ROBDD);
    tearing the high speed VLSI circuit into an open circuits and corresponding Thevenin equivalent circuits;
    calculating a kth-order moment model of the open circuit using a recursive moment calculator;
    calculating zeroth-order moments of the Thevenin equivalent circuits;
    using a superposition theorem for the calculated kth-order system moment model and the zeroth-order moments to obtain system moments of the high speed VLSI circuit; and
    saving the obtained system moments of the high speed VLSI circuit.

2. The method as claimed in claim 1, wherein the ROBDD includes first and second classes of blocks,
    the first class of blocks being the Thevenin circuits where all independent sources are set to be zero, links $\{b_{L,1}, b_{L,2}, \ldots b_{L,i}\}$ are opened, and link $b_{L,j}$ is replaced with a 1 A current source; and
    the second class of blocks being the kth-order moment model where links $\{b_{L,1}, b_{L,2}, \ldots b_{L,i}\}$ are opened, with i being the number of links in the high speed VLSI circuit, with j being the number of resistor links in the high speed VLSI circuit, and with L representing the resistor loop.

3. The method as claimed in claim 1, wherein except for circuits in the second class of blocks, all other circuits are independent on order k, the voltages of circuits in first class of blocks need to be saved for updating moments of of the open circuit in the second class of blocks.

* * * * *